(12) United States Patent
Chen

(10) Patent No.: US 8,203,156 B2
(45) Date of Patent: Jun. 19, 2012

(54) LIGHT-EMITTING DIODE STRUCTURE

(75) Inventor: Kuan-Yu Chen, Taipei County (TW)

(73) Assignee: Everlight Electronics Co., Ltd., Taipei (TW)

( * ) Notice: Subject to any disclaimer, the term of this patent is extended or adjusted under 35 U.S.C. 154(b) by 157 days.

(21) Appl. No.: 12/774,128

(22) Filed: May 5, 2010

(65) Prior Publication Data

US 2011/0079807 A1    Apr. 7, 2011

(30) Foreign Application Priority Data

Oct. 2, 2009   (TW) .............................. 98133544 A

(51) Int. Cl.
*H01H 33/00*    (2006.01)

(52) U.S. Cl. ....... 257/88; 257/99; 257/66; 257/E21.134; 257/E21.189; 257/E21.352; 257/E31.099; 257/E31.105

(58) Field of Classification Search .................... 257/88, 257/98, 99, 666, 678, E21.134, 189, 352, 257/E31.099, 105
See application file for complete search history.

(56) References Cited

U.S. PATENT DOCUMENTS

| | | | |
|---|---|---|---|
| 6,417,019 B1 * | 7/2002 | Mueller et al. | 438/29 |
| 7,268,371 B2 * | 9/2007 | Krames et al. | 257/98 |
| 2006/0119250 A1 | 6/2006 | Suehiro et al. | |
| 2007/0297168 A1 | 12/2007 | Chang et al. | |

FOREIGN PATENT DOCUMENTS

| | | |
|---|---|---|
| CN | 1586017 A | 2/2005 |
| CN | 1925179 A | 3/2007 |
| TW | 200801716 | 1/2008 |

* cited by examiner

*Primary Examiner* — David Nhu
(74) *Attorney, Agent, or Firm* — Muncy, Geissler, Olds & Lowe, PLLC

(57) ABSTRACT

A light-emitting diode structure includes a base with a recessed portion, a light-emitting chip and a light-transmissive block. The light-emitting chip disposed in the recessed portion of the base and emits a light beam. The light-transmissive block disposed on the base covers the recessed portion and the light-emitting chip, so that the light beam emitted from the light-emitting chip is radiated outwardly via the light-transmissive block. The light-transmissive block is a flat-top multilateral cone including a bottom surface, a top surface, and several side surfaces connected to and located between the bottom surface and the top surface. A slot with a bottom portion is formed on the top surface of the light-transmissive block.

18 Claims, 10 Drawing Sheets

LIGHT-EMITTING DIODE STRUCTURE

CROSS REFERENCE TO RELATED APPLICATIONS

This Application claims priority of Taiwan Patent Application No. 098133544, filed on Oct. 2, 2009, the entirety of which is incorporated by reference herein.

BACKGROUND OF THE INVENTION

1. Field of the Invention

The present invention relates to a light-emitting diode structure, and in particular, relates to a light-emitting diode structure providing a normal light and a lateral light with increased brightness.

2. Description of the Related Art

With continued advancements in light-emitting diode technology, current light-emitting diodes have high brightness, long lifespan, energy efficiency, and high response times and are safe and applied in many different fields.

For conventional surface mount light-emitting diode structures, a light-emitting chip is disposed on a base, and the base is provided with an opening for light to emit therefrom. However, when light is emitted from the light-emitting chip, part of the light incident onto the sidewall of the base is absorbed, or reflected and scattered. Thus, decreasing brightness of the emitted light.

BRIEF SUMMARY OF THE INVENTION

In view of the shortcomings of the conventional surface mount light-emitting diode structures described above, the invention provides a light-emitting diode structure providing a normal light and a lateral light with increased brightness. The light-emitting diodes utilizing the light-emitting diode structure of the invention may be used in decorative lights or as backlight light sources, but is not limited thereto.

In one embodiment of the invention, the light-emitting diode structure comprises a base having a recessed portion, a light-emitting chip and a light-transmissive block. The light-emitting chip is disposed in the recessed portion of the base to emit a light beam. The light-transmissive block, formed as a flat-top multilateral cone, is disposed on the base to cover the recessed portion of the base and the light-emitting chip to direct the light beam emitted from the light-emitting chip to radiate outwardly therethrough. The light-transmissive block comprises a bottom surface, a top surface, and a plurality of side surfaces connected to and located between the bottom surface and the top surface.

The bottom surface of the light-transmissive block and one of the plurality of side surfaces of the light-transmissive block form an acute or obtuse angle therebetween.

The light-transmissive block is formed as a flat-top quadrilateral cone.

A cross section of the light-transmissive block comprises a trapezoid or inversed-trapezoid shape.

The light-emitting diode structure further comprises a reflective cover disposed in the recessed portion of the base. The light-emitting diode structure further comprises a metallic layer disposed on an inner surface of the recessed portion of the base to form the reflective cover.

The base comprises a thermal-conductive material.

The base comprises a silicon-containing substrate or a ceramic substrate.

In one embodiment of the invention, the light-emitting diode structure comprises a base having a recessed portion, a light-emitting chip and a light-transmissive block. The light-emitting chip is disposed in the recessed portion of the base to emit a light beam. The light-transmissive block, formed as a flat-top multilateral cone, is disposed on the base to cover the recessed portion of the base and the light-emitting chip to direct the light beam emitted from the light-emitting chip to radiate outwardly therethrough. The light-transmissive block comprises a bottom surface, a top surface, and a plurality of side surfaces connected to and located between the bottom surface and the top surface, wherein a slot with a bottom portion is formed on the top surface of the light-transmissive block.

The bottom surface of the light-transmissive block and one of the plurality of side surfaces of the light-transmissive block form an acute or obtuse angle therebetween.

The light-transmissive block is formed as a flat-top quadrilateral cone.

A shape for an opening of the slot is a round, rectangular, elliptic or polygonal shape.

A shape of the bottom portion of the slot is equal to that of an opening of the slot.

The slot further comprises a sidewall, and the bottom portion of the slot and the sidewall of the slot form a rectangle or obtuse angle therebetween.

The light-emitting diode structure further comprises a reflective cover disposed in the recessed portion of the base.

The light-emitting diode structure further comprises a metallic layer disposed on an inner surface of the recessed portion of the base to form the reflective cover.

The base comprises a thermal-conductive material.

The base comprises a silicon-containing substrate or a ceramic substrate.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
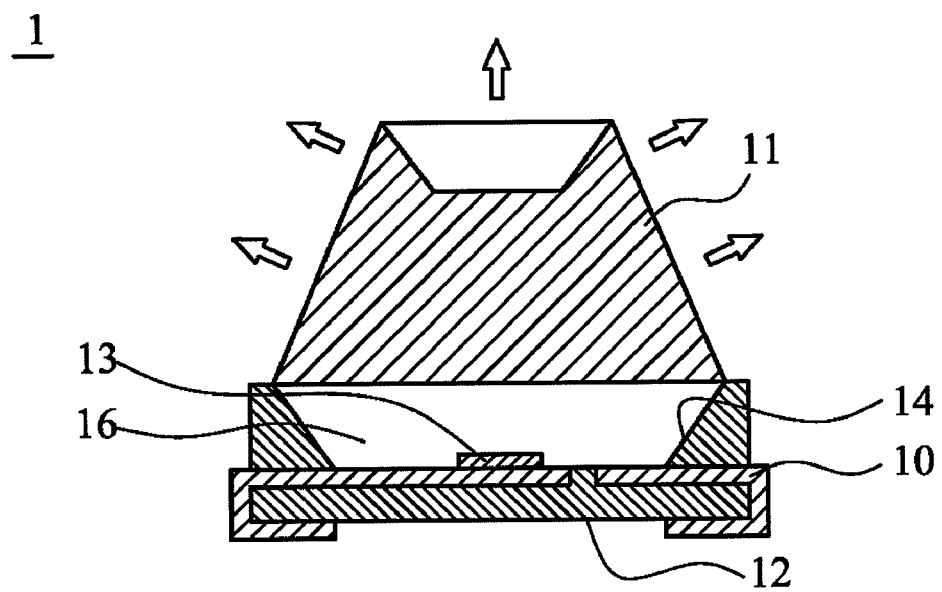
FIG. 1 is a schematic view of a light-emitting diode structure of a first embodiment of the invention.

FIG. 1 is a schematic view of a light-emitting diode structure 1 of a first embodiment. The light-emitting diode structure 1 comprises a conductive lead frame 10, a light-transmissive block 11, a base 12 having a recessed portion 16, and a light-emitting chip 13. The conductive lead frame 10 disposed in the base 12 is partially exposed by the recessed portion 16 of the base 12. The light-emitting chip 13 disposed in the recessed portion 16 of the base 12 is disposed on and electrically connected to the conductive lead frame 10 to emit a light beam. A reflective cover (not shown in FIGS.) such as a light-reflective metallic layer is disposed on an inner surface of the recessed portion 16 of the base 12 which contains a sidewall 14, to upwardly reflect the light beam generating from the light-emitting chip 13. The base 12 is made of a thermal-conductive material, such as a silicon-containing substrate or a ceramic substrate.

Figure 2:
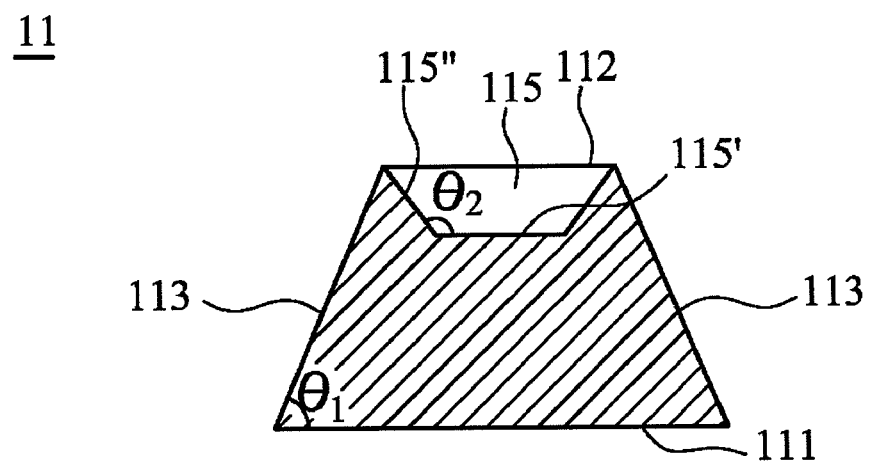
FIG. 2 is a sectional view of a light-transmissive block of a light-emitting diode structure of a first embodiment of the invention.
Figure 3:
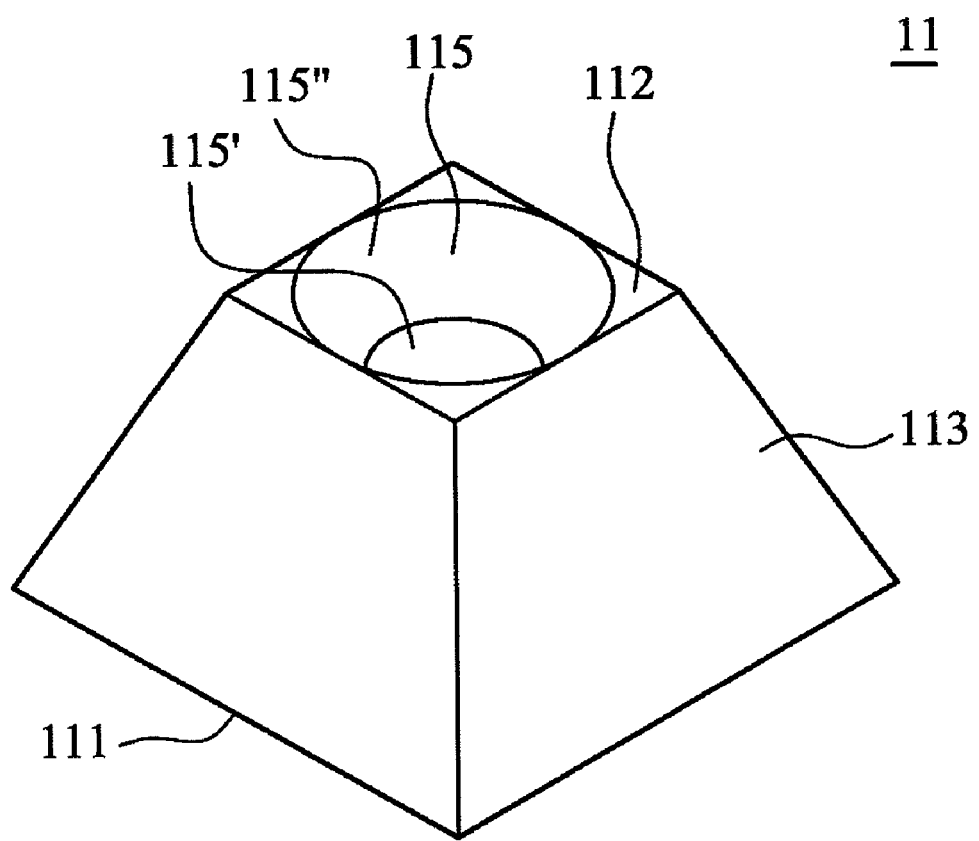
FIG. 3 is a sectional view of a light-transmissive block of a light-emitting diode structure of a first embodiment of the invention.

The light-transmissive block 11 is disposed on the base 12 to cover the recessed portion 16 of the base 12 and the light-emitting chip 13 disposed in the recessed portion 16 of the base 12, so that the light beam emitting from the light-emitting chip 13 is allowed to radiate outwardly through the light-transmissive block 11, and the view angle of the light beam can be altered. In FIG. 1, arrows show the direction of the view angle of the light beam. Referring to FIGS. 2 and 3 simultaneously, the light-transmissive block 11 is formed as a flat-top quadrilateral cone in this embodiment. In another embodiment, the light-transmissive block 11 can be a flat-top multilateral cone.

The light-transmissive block 11 comprises a bottom surface 111, a top surface 112, and four side surfaces 113 connected to and located between the bottom surface 111 and the top surface 112. In this embodiment, a cross section of the light-transmissive block 11 substantially has a trapezoid or inversed-trapezoid shape and therefore the side surfaces 113 are slanted surfaces, so that intensity of the lateral light beams can be increased. A slot 115 with a bottom portion 115' formed on the top surface 112 of the light-transmissive block 11 is utilized to focus the light beam to increase the intensity of the normal light beam. In this embodiment, the shape of an opening of the slot 115 is circular, a sidewall 115" of the slot 115 is slanted, and the bottom portion 115' of the slot 115 is circular. In other embodiments, the shape of the opening of the slot 115 can be rectangular, elliptic or polygonal shaped, and the shape of the bottom portion 115' of the slot 115 can be equal to that of the opening of the slot 115. Because the intensities of the normal light beam and the lateral light beams can be increased, the light-emitting diode structure 1 of the first embodiment therefore may be used in decorative lights or as backlight light sources, but is not limited thereto.

In the first embodiment, the reference symbol $\theta 1$ is defined as an angle formed between the bottom surface 111 and the side surfaces 113 of the light-transmissive block 11, the angle $\theta 1$ is an acute angel as the light-transmissive block 11 substantially has a trapezoid cross section, and the angle $\theta 1$ is an obtuse angel as the light-transmissive block 11 substantially has the inversed-trapezoid cross section. Reference symbol $\theta 2$ is defined as an angle formed between the bottom portion 115' and the sidewall 115" of the slot 115. In general, an angle $\theta 2$ not less than 90 degrees and less than 180 degrees ($90° \leq \theta 2 < 180°$) is applicable.

Figure 4:
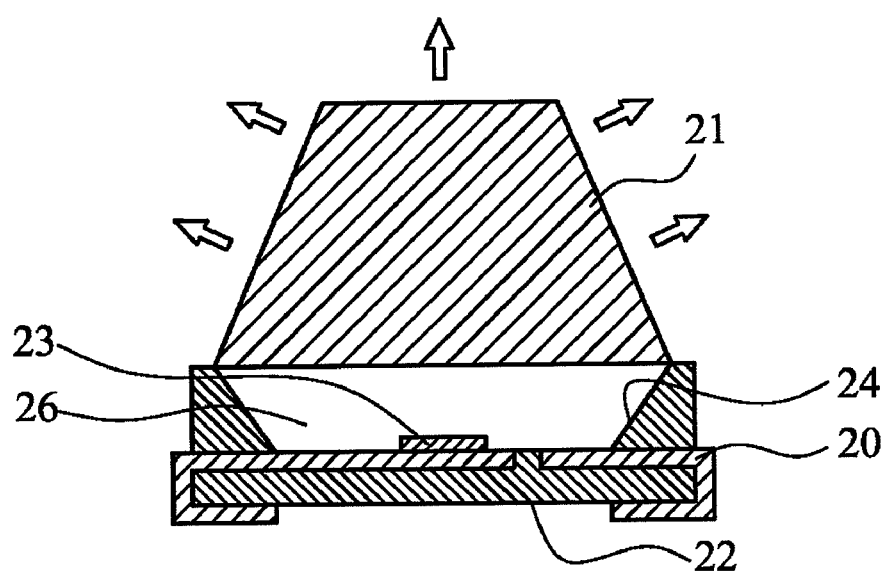
FIG. 4 is a schematic view of a light-emitting diode structure of a second embodiment of the invention.

FIG. 4 is a schematic view of a light-emitting diode structure 2 of a second embodiment. The light-emitting diode structure 2 comprises a conductive lead frame 20, a light-transmissive block 21, a base 22 having a recessed portion 26, and a light-emitting chip 23. The conductive lead frame 20 disposed in the base 22 is partially exposed by the recessed portion 26 of the base 22. The light-emitting chip 23 disposed in the recessed portion 26 of the base 22 is disposed on and electrically connected to the conductive lead frame 20 to emit a light beam. A reflective cover (not shown in FIGS.) such as a light-reflective metallic layer, is disposed on an inner surface of the recessed portion 26 of the base 22 which contains a sidewall 24, to upwardly reflect the light beam generating from the light-emitting chip 23. The base 22 is made of a thermal-conductive material, such as a silicon-containing substrate or a ceramic substrate.

Figure 5:
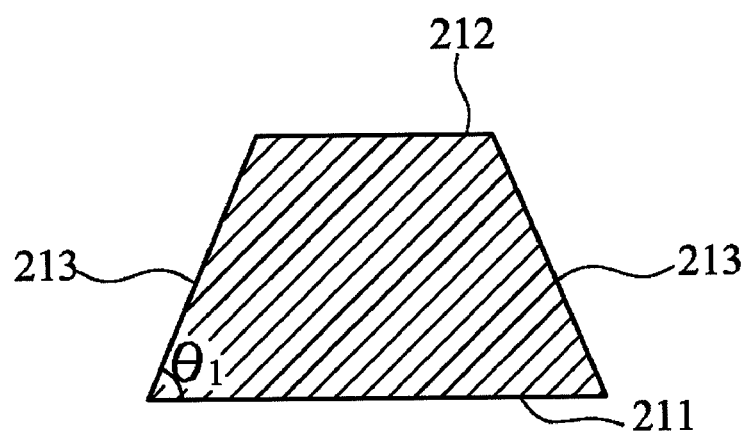
FIG. 5 is a sectional view of a light-transmissive block of a light-emitting diode structure of a second embodiment of the invention.
Figure 6:
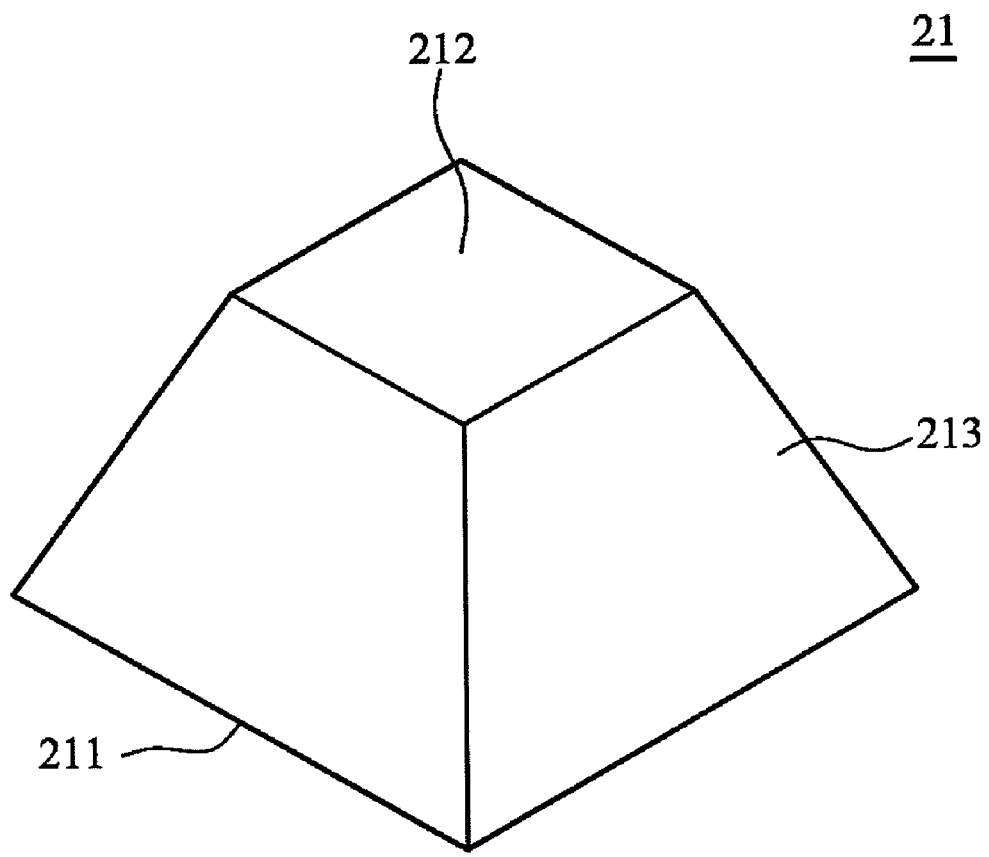
FIG. 6 is a sectional view of a light-transmissive block of a light-emitting diode structure of a second embodiment of the invention.

The light-transmissive block 21 is disposed on the base 22 to cover the recessed portion 26 of the base 22 and the light-emitting chip 23 disposed in the recessed portion 26 of the base 22, so that the light beam emitted from the light-emitting chip 23 is allowed to radiate outwardly through the light-transmissive block 21, and the view angle of the light beam can be altered. In FIG. 4, arrows show the direction of the view angle of the light beam. Referring to FIGS. 5 and 6 simultaneously, the light-transmissive block 21 is formed as a flat-top quadrilateral cone in this embodiment. In another embodiment, the light-transmissive block 21 can be a flat-top multilateral cone.

The light-transmissive block 21 comprises a bottom surface 211, a top surface 212, and four side surfaces 213 connected to and located between the bottom surface 211 and the top surface 212. In this embodiment, a cross section of the light-transmissive block 21 substantially has a trapezoid or inversed-trapezoid shape and therefore the side surfaces 213 are slanted surfaces, and an angle $\theta 1$ formed between the bottom surface 211 and the side surfaces 213 of the light-transmissive block 21 is an acute or obtuse angel, so that intensity of the lateral light beams can be increased.

The light-emitting diode structure 2 differs from the light-emitting diode structure 1 of the first embodiment in that the light-emitting diode structure 2 is not provided a slot formed on the top surface 212 of the light-transmissive block 21.

Figure 7:
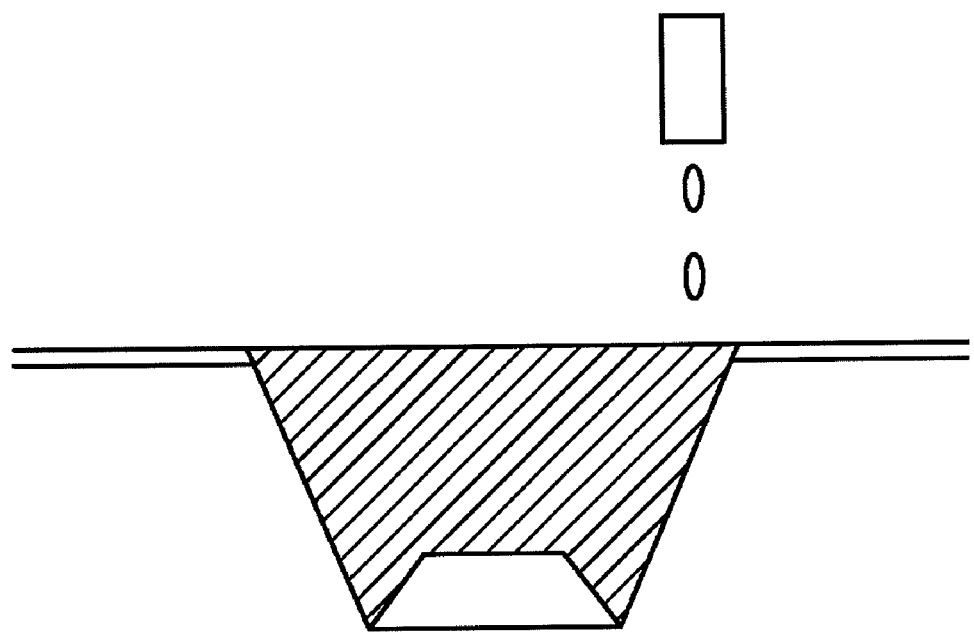
FIGS. 7 to 9 are views showing a manufacturing process of a light-emitting diode structure of the invention.
Figure 8:
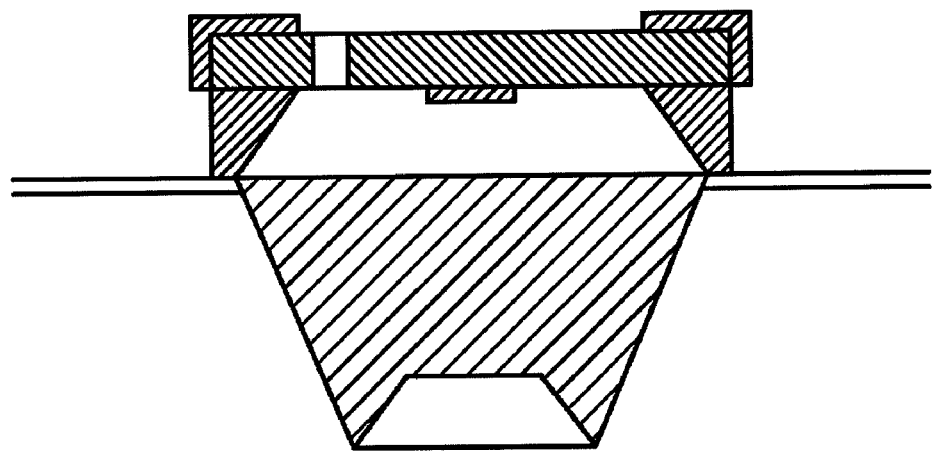
Figure 9:
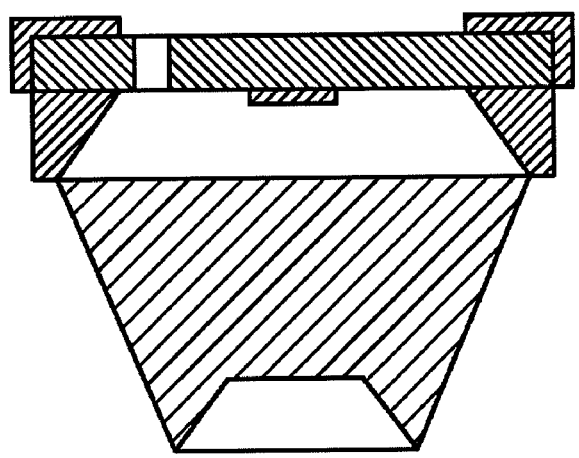

FIGS. 7 to 9 are views showing a manufacturing process of the light-emitting diode structure of the first embodiment having a slot formed on the light-transmissive block. In FIG. 7, epoxy is injected into a mold cup to form a light-transmissive block. In FIG. 8, a front surface of a baked base is downwardly faced to connect to the mold cup, and then the base and the mold cup are pressurized to increase the seal therebetween. In FIG. 9, when the light-emitting diode structure is released from the mold cup after baking, the manufacturing process of the light-emitting diode structure is finished.

Figure 10:
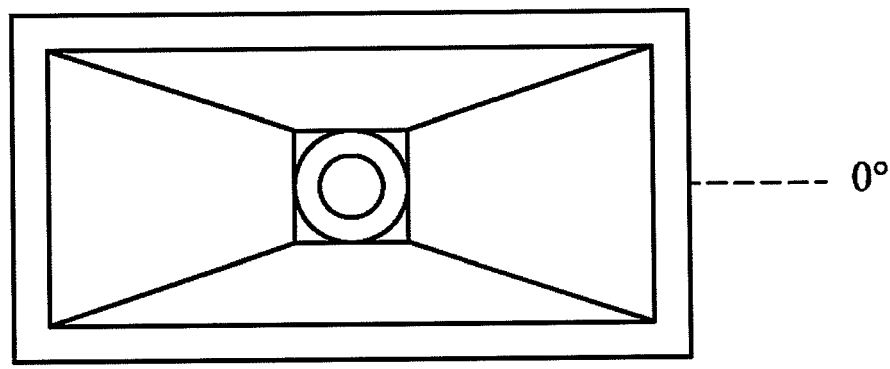
FIG. 10 is a view of a light-emitting diode structure disposed with a zero degree angle simulated by computer simulation.
Figure 11:
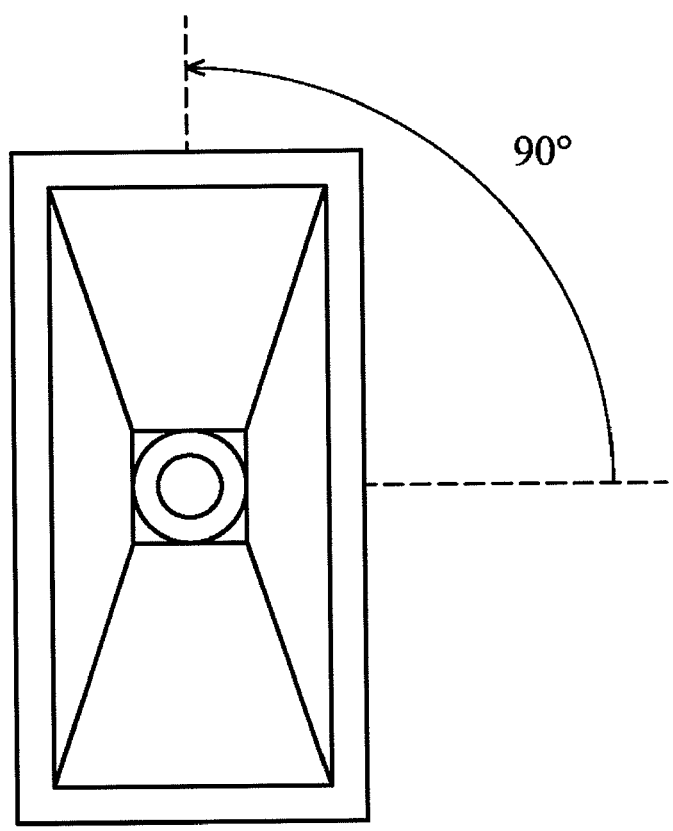
FIG. 11 is a view of a light-emitting diode structure disposed with a 90 degree angle simulated by computer simulation.
Figure 12:
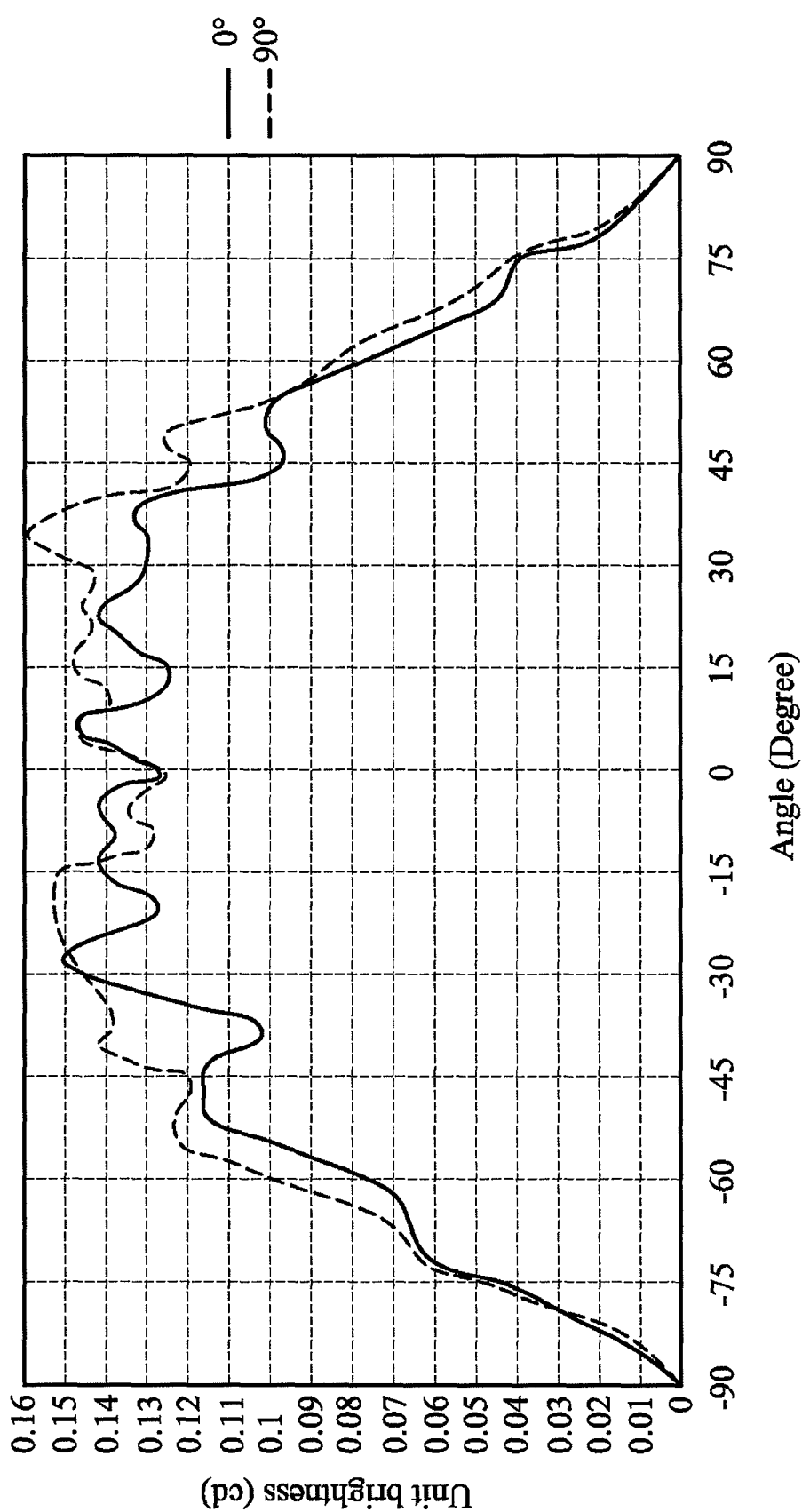
FIG. 12 is a computer simulation diagram of a light-emitting diode structure without a light-transmissive block.
Figure 13:
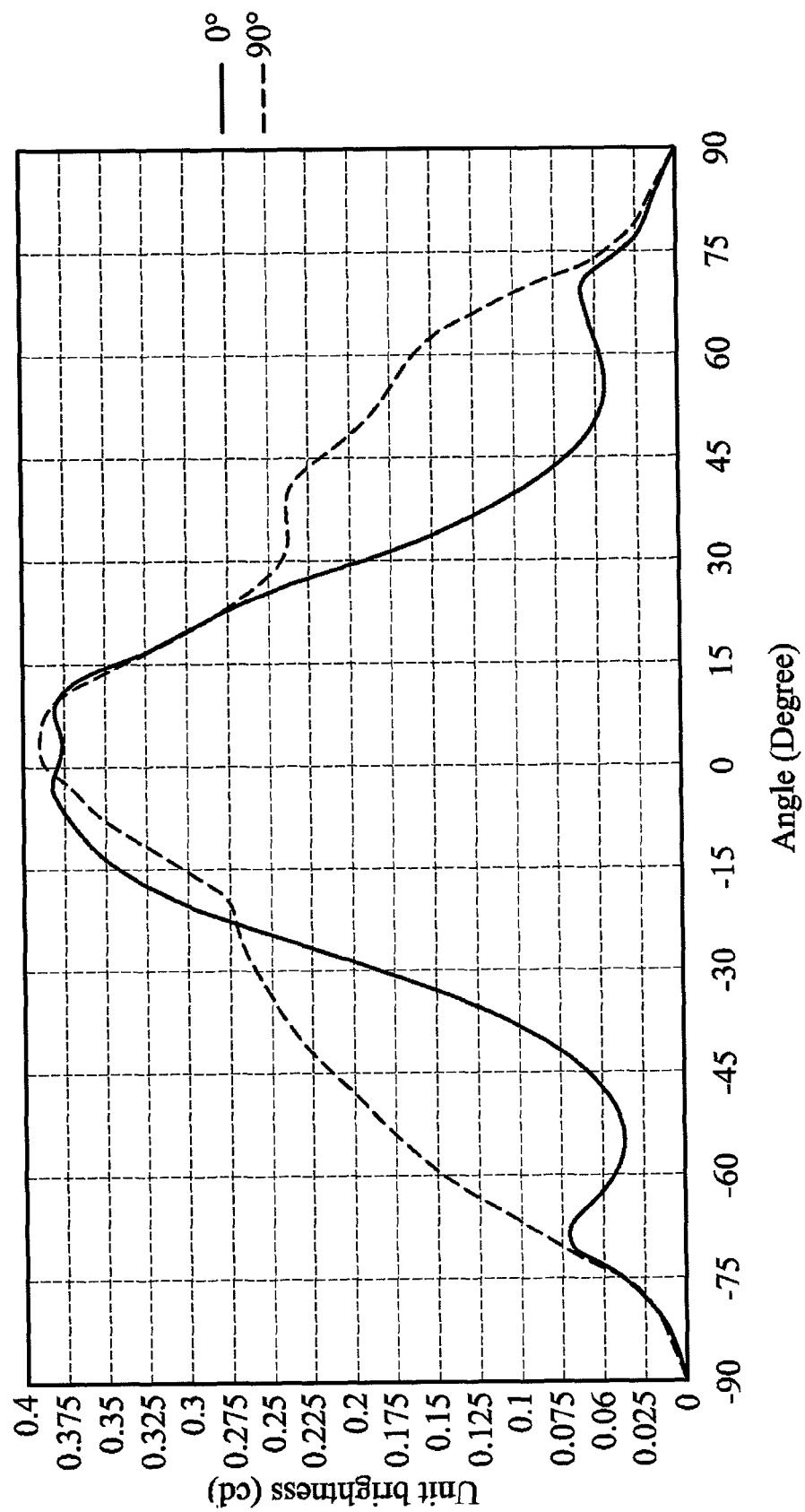
FIG. 13 is a computer simulation diagram of a light-emitting diode structure (provided with a light-transmissive block) of a first embodiment of the invention.
Figure 14:
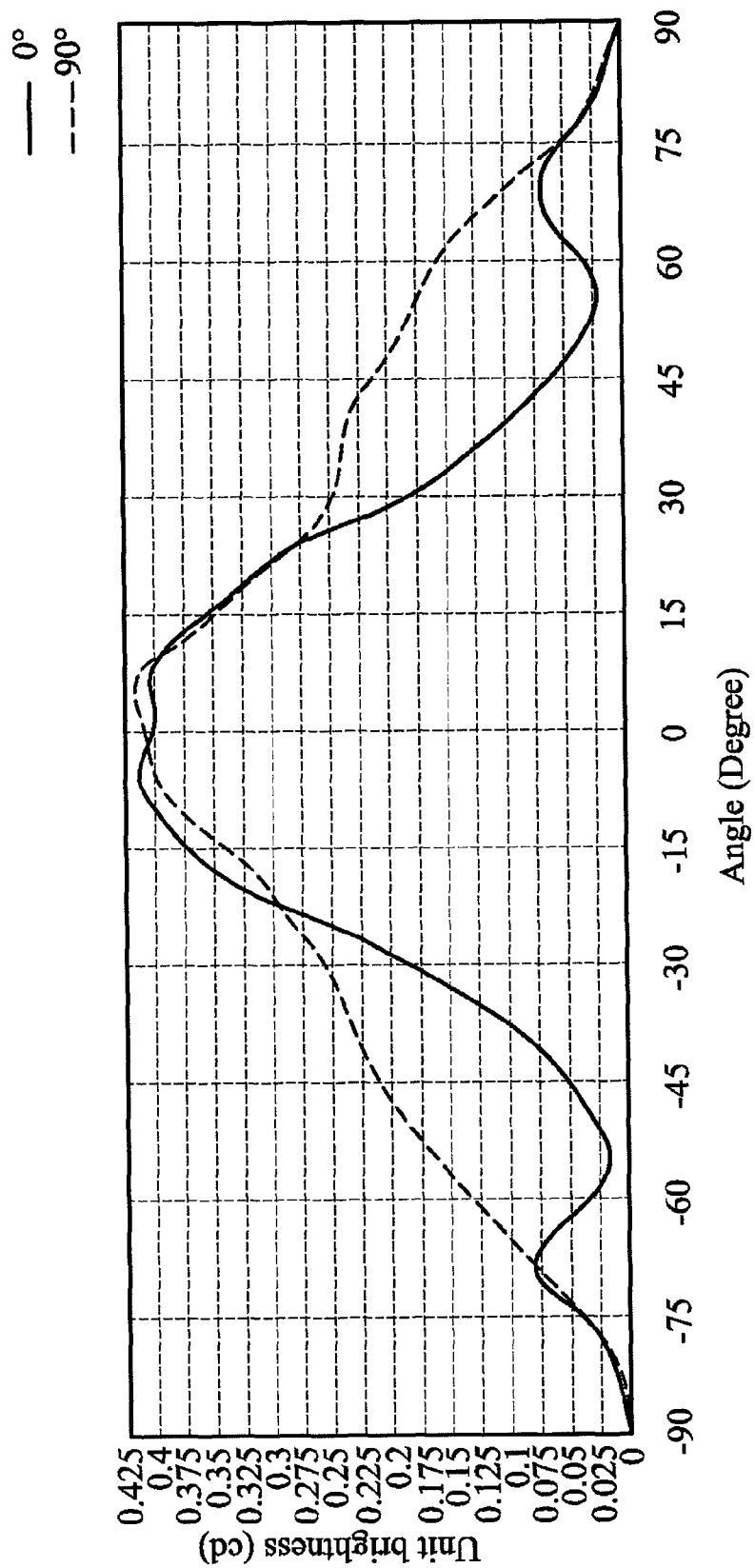
FIG. 14 is a computer simulation diagram of a light-emitting diode structure (provided with a light-transmissive block) of a second embodiment of the invention.

The difference between a light-emitting diode structure provided with a light-transmissive block and a light-emitting diode structure without a light-transmissive block can be understood by computer simulation. In a computer simulation, a zero degree and 90 degree angle are used for simulation. FIG. 10 is a view of a light-emitting diode structure disposed with a zero degree angle simulated by computer simulation, and FIG. 11 is a view of a light-emitting diode structure disposed with a 90 degree angle simulated by computer simulation. FIG. 12 is a computer simulation diagram of a light-emitting diode structure without a light-transmissive block. FIG. 13 is a computer simulation diagram of the light-emitting diode structure (provided with a light-transmissive block therein) of the first embodiment, where the angle θ1 is 68 degrees and the angle θ2 is 120 degrees. FIG. 14 is a computer simulation diagram of the light-emitting diode structure (provided with the light-transmissive block therein) of the second embodiment, where the angle θ1 is 68 degrees.

In comparison with FIG. 12 and FIG. 13, it is understood that the light-emitting diode structure incorporated with the trapezoid light-transmissive block of the first embodiment, substantially provides a forty-five percent increase in brightness for the same angle as the previous case. Also, the light-emitting diode structure incorporated with the trapezoid light-transmissive block of the first embodiment provides a centralized and round light pattern.

In FIG. 14, it is understood that the maximum brightness of the light-emitting diode structure of the second embodiment (no slot provided therein) is approximately greater than that of the light-emitting diode structure of the first embodiment (provided with slot therein).

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light-emitting diode (LED) structure, comprising:
   a base comprising a recessed portion;
   a light-emitting chip disposed in the recessed portion of the base for emitting a light beam; and
   a light-transmissive block formed as a flat-top multilateral cone and disposed on the base to cover the recessed portion of the base and the light-emitting chip to direct the light beam emitted from the light-emitting chip to radiate outwardly therethrough, comprising a bottom surface, a top surface, and a plurality of side surfaces connected to and located between the bottom surface and the top surface.

2. The light-emitting diode structure as claimed in claim 1, wherein the bottom surface of the light-transmissive block and one of the plurality of side surfaces of the light-transmissive block form an acute or obtuse angle therebetween.

3. The light-emitting diode structure as claimed in claim 2, wherein the light-transmissive block is formed as a flat-top quadrilateral cone.

4. The light-emitting diode structure as claimed in claim 3, wherein a cross section of the light-transmissive block comprises a trapezoid shape or an inversed-trapezoid shape.

5. The light-emitting diode structure as claimed in claim 1 further comprising a reflective cover disposed in the recessed portion of the base.

6. The light-emitting diode structure as claimed in claim 5 further comprising a metallic layer disposed on an inner surface of the recessed portion of the base to form the reflective cover.

7. The light-emitting diode structure as claimed in claim 1, wherein the base comprises a thermal-conductive material.

8. The light-emitting diode structure as claimed in claim 7, wherein the base comprises a silicon-containing substrate or a ceramic substrate.

9. A light-emitting diode (LED) structure, comprising:
   a base comprising a recessed portion;
   a light-emitting chip disposed in the recessed portion of the base to emit a light beam; and
   a light-transmissive block formed as a flat-top multilateral cone and disposed on the base to cover the recessed portion of the base and the light-emitting chip to direct the light beam emitted from the light-emitting chip to radiate outwardly therethrough, comprising a bottom surface, a top surface, and a plurality of side surfaces connected to and located between the bottom surface and the top surface, wherein a slot with a bottom portion is formed on the top surface of the light-transmissive block.

10. The light-emitting diode structure as claimed in claim 9, wherein the bottom surface of the light-transmissive block and one of the plurality of side surfaces of the light-transmissive block form an acute or obtuse angle therebetween.

11. The light-emitting diode structure as claimed in claim 10, wherein the light-transmissive block is formed as a flat-top quadrilateral cone.

12. The light-emitting diode structure as claimed in claim 9, wherein a shape for an opening of the slot is a round, rectangular, elliptic or polygonal shape.

13. The light-emitting diode structure as claimed in claim 9, wherein a shape of the bottom portion of the slot is equal to that of an opening of the slot.

14. The light-emitting diode structure as claimed in claim 9, wherein the slot further comprises a sidewall, and the bottom portion of the slot and the sidewall of the slot form a rectangle or obtuse angle therebetween.

15. The light-emitting diode structure as claimed in claim 9 further comprising a reflective cover disposed in the recessed portion of the base.

16. The light-emitting diode structure as claimed in claim 15 further comprising a metallic layer disposed on an inner surface of the recessed portion of the base to form the reflective cover.

17. The light-emitting diode structure as claimed in claim 9, wherein the base comprises a thermal-conductive material.

18. The light-emitting diode structure as claimed in claim 17, wherein the base comprises a silicon-containing substrate or a ceramic substrate.

* * * * *